United States Patent
Chiang

(10) Patent No.: US 6,977,347 B2
(45) Date of Patent: Dec. 20, 2005

(54) FLEXIBLE PRINTED CIRCUIT BOARD

(75) Inventor: Chih-Hsiang Chiang, Chung-Li (TW)

(73) Assignee: Darfon Electronics Corp, Taoyuan (TW)

( * ) Notice: Subject to any disclaimer, the term of this patent is extended or adjusted under 35 U.S.C. 154(b) by 380 days.

(21) Appl. No.: 10/157,511

(22) Filed: May 28, 2002

(65) Prior Publication Data

US 2002/0181210 A1 Dec. 5, 2002

(30) Foreign Application Priority Data

Jun. 5, 2001 (TW) .............................. 90209302 U

(51) Int. Cl.[7] .............................................. H05K 1/00
(52) U.S. Cl. ...................... 174/254; 174/255; 174/262; 174/268; 361/748
(58) Field of Search ................................ 174/254, 259, 174/262–266, 268, 255; 361/748–751, 792–795

(56) References Cited

U.S. PATENT DOCUMENTS 5,800,650 A * 9/1998 Anderson et al. ........... 156/150
6,139,777 A * 10/2000 Omoya et al. .............. 252/500
6,281,452 B1 * 8/2001 Prasad et al. ............... 174/262
6,300,575 B1 * 10/2001 Appelt et al. ............... 174/256
6,329,609 B1 * 12/2001 Kaja et al. .................. 174/262
6,445,589 B2 * 9/2002 Chengalva .................. 361/760
6,465,084 B1 * 10/2002 Curcio et al. ............... 428/209

* cited by examiner

Primary Examiner—Kamand Cuneo
Assistant Examiner—Jeremy Norris
(74) Attorney, Agent, or Firm—Ladas & Parry LLP

(57) ABSTRACT

A flexible printed circuit board. The board includes a first circuit layer, a second circuit layer, a first adhesive layer, a second adhesive layer and an intermediate layer. The second circuit layer face the first circuit layer, and the first adhesive layer is disposed on the first circuit layer. The second adhesive layer, facing the first adhesive layer, is disposed on the second circuit layer. The intermediate layer, having a plurality of first through holes, is disposed between the first circuit layer and the second circuit layer. The first adhesive layer adheres directly to the second adhesive layer through the first through holes.

5 Claims, 8 Drawing Sheets

10

30

FLEXIBLE PRINTED CIRCUIT BOARD

BACKGROUND OF THE INVENTION

1. Field of the Invention

The invention relates to a flexible printed circuit board; in particular, to a flexible printed circuit board that can maintain both its waterproof properties and sensitivity between its switches.

2. Description of the Related Art

A known printed circuit board is an indispensable component in electric and/or electronic devices. In a printed circuit board in general, a circuit, comprising a plurality of lines, for electrically connecting IC-chips, resistors, capacitors and so forth, is made by conductive thin copper foil lines and an insulating base plate, on which the circuit is printed. A printed circuit board having such a structure has been widely used due to its accuracy for circuit arrangement, compactness, and easy assembly for installation into devices.

As a type of improvement from the printed circuit board, a flexible printed circuit board (FPC) has been developed. In addition to the merits mentioned for the printed circuit board, a flexible printed circuit board can be laid out with a high degree of freedom due to flexibility in narrow spaces in machines and devices. This has been considered a merit of flexible printed circuit boards. Another is its waterproof properties.

The conventional flexible printed circuit board is commonly divided into two types: two-layer and three-layer.

A two-layer flexible printed circuit board 10 is shown in FIG. 1a, and comprises a first circuit layer 11, a second circuit layer 12, a first adhesive layer 13 and a second adhesive layer 14.

The first circuit layer 11 is provided with a plurality of first through holes 111, a plurality of first switches 112, and a first circuit 113 for electrically connecting the first switches 112. The second circuit layer 12 is provided with a plurality of second through holes 121 corresponding to the first through holes 111, a plurality of second switches 122 corresponding to the first switches 112, and a second circuit 123 for electrically connecting the second switches 122. The second switches 122, disposed on the second circuit layer 12, face the first switches 112 disposed on the first circuit layer 11. That is, the second switches 122 are disposed on a surface, facing the first circuit layer 11, of the second circuit layer 12, and the first switches 112 are disposed on a surface, facing the second circuit layer 12, of the first circuit layer 11.

The first adhesive layer 13 is disposed on the first circuit layer 11 in a manner such that it surrounds the first through holes 111 and the first switches 112. The second adhesive layer 14 is disposed on the second circuit layer 12 in a manner such that it surrounds the second through holes 121 and the second switches 122.

As shown in FIG. 1b, a cable 15 is electrically connected with the first circuit 113 of the first circuit layer 11 and the second circuit 123 of the second circuit layer 12 respectively.

A predetermined distance must be maintained between the first circuit 113 and the second circuit 123 so as to prevent a short circuit between them. Furthermore, the distance between the first switches 112 and the second switches 122 must be sufficient to keep a predetermined sensitivity between them.

However, in the conventional flexible printed circuit board 10, the distance between the first circuit layer 11 and second circuit layer 12 is maintained only by the adhesive layers so that short circuits between the first circuit 113 and the second circuit 123 occur easily. In addition, the sensitivity between the first switches 112 and the second switches 122 is too great due to the same reason.

A three-layer flexible printed circuit board 20 is shown in FIG. 2a, and comprises a first circuit layer 21, a second circuit layer 22, an intermediate layer 25, a first adhesive layer 23 and a second adhesive layer 24.

The first circuit layer 21 is provided with a plurality of first through holes 211, a plurality of first switches 212, and a first circuit 213 for electrically connecting the first switches 212. The second circuit layer 22 is provided with a plurality of second through holes 221 corresponding to the first through holes 211, a plurality of second switches 222 corresponding to the first switches 212, and a second circuit 223 for electrically connecting the second switches 222. The second switches 222, disposed on the second circuit layer 22, face the first switches 212 disposed on the first circuit layer 21. That is, the second switches 222 are disposed on a surface, facing the first circuit layer 21, of the second circuit layer 22, and the first switches 212 are disposed on a surface, facing the second circuit layer 22, of the first circuit layer 21.

The first adhesive layer 23 is disposed on the first circuit layer 21 in a manner such that it surrounds the first through holes 211 and the first switches 212. The second adhesive layer 24 is disposed on the second circuit layer 22 in a manner such that it surrounds the second through holes 221 and the second switches 222.

The intermediate layer 25, disposed between the first circuit layer 21 and the second circuit layer 22, is provided with a plurality of third through holes 251 and a plurality of fourth through holes 252. Each of the third through holes 251 corresponds to the first through holes 211 and the second through holes 221 respectively, and each of the fourth through holes 252 corresponds to the first switches 212 and the second switches 222 respectively.

As shown in FIG. 2b, a cable 26 is electrically connected with the first circuit 213 of the first circuit layer 21 and the second circuit 223 of the second circuit layer 22 respectively.

As stated above, a predetermined distance must be maintained between the first circuit 213 and the second circuit 223 so as to prevent short circuit between them. Furthermore, the distance between the first switches 212 and the second switches 222 must be sufficient to keep a predetermined sensitivity between them.

In the conventional flexible printed circuit board 20, the distance between the first circuit layer 21 and second circuit layer 22 is maintained by the intermediate layer 25. That is, both the first adhesive layer 23 and the second adhesive layer 24 adhere to the intermediate layer 25.

Since the flexible printed circuit board must be waterproof, the thickness of the first adhesive layer 23 and the second adhesive layer 24 must be enough to maintain the waterproof properties. Hence, because the first adhesive layer 23 and the second adhesive layer 24 cannot directly adhere to each other, the waterproof properties of such flexible printed circuit board 20 is not good. In addition, since both the first adhesive layer 23 and the second adhesive layer 24 are provided with a predetermined thickness, the sensitivity between the first switches 212 and the second switches 222 is insufficient.

SUMMARY OF THE INVENTION

In order to address the disadvantages of the aforementioned flexible printed circuit board, the invention provides a flexible printed circuit board that can maintain both its waterproof properties and the sensitivity between its switches.

Accordingly, the invention provides a flexible printed circuit board. It comprises a first circuit layer, a second circuit layer, a first adhesive layer, a second adhesive layer and an intermediate layer. The second circuit layer face the first circuit layer, and the first adhesive layer is disposed on the first circuit layer. The second adhesive layer, facing the first adhesive layer, is disposed on the second circuit layer. The intermediate layer, having a plurality of first through holes, is disposed between the first circuit layer and the second circuit layer. The first adhesive layer directly adheres to the second adhesive layer through the first through holes.

In an embodiment, the first circuit layer is provided with a plurality of first switches corresponding to the first through holes respectively, and the first adhesive layer surrounds the first switches. The second circuit layer is provided with a plurality of second switches corresponding to the first switches respectively, and the second adhesive layer surrounds the second switches.

Furthermore, the first circuit layer is provided with a first circuit for electrically connecting the first switches, and the second circuit layer is provided with a second circuit for electrically connecting the second switches.

Furthermore, the flexible printed circuit board comprises a cable electrically connecting the first circuit and the second circuit.

Furthermore, each of the first switches contacts the corresponding second switch through the corresponding first through hole in a separable manner.

In another preferred embodiment, the first circuit layer is provided with a plurality of second through holes, and the first adhesive layer surrounds the second through holes. The second circuit layer is provided with a plurality of third through holes corresponding to the second through holes respectively, and the second adhesive layer surrounds the third through holes. The intermediate layer is provided with a plurality of fourth through holes corresponding to the third through holes respectively. Each of the fourth through holes is bigger than the corresponding second through hole and the corresponding third through hole so that the first adhesive layer directly adheres to the second adhesive layer.

In another preferred embodiment, the invention provides another flexible printed circuit board. It comprises a first circuit layer, a second circuit layer, a first adhesive layer, a second adhesive layer and an intermediate layer. The second circuit layer face the first circuit layer, and the first adhesive layer is disposed on the first circuit layer. The second adhesive layer, facing the first adhesive layer, is disposed on the second circuit layer. The intermediate layer is disposed between the first circuit layer and the second circuit layer. The intermediate layer is substantially smaller than both the first circuit layer and the second circuit layer so that the first adhesive layer directly adheres to the second adhesive layer.

BRIEF DESCRIPTION OF THE DRAWINGS

The invention is hereinafter described in detail with reference to the accompanying drawings in which:

FIG. 3c is a partial enlarged view of a first through hole, a second through hole and a third through hole as shown in FIG. 3a;

FIG. 4b is a partial enlarged view of a first circuit layer, a second circuit layer and an intermediate layer as shown in FIG. 4a.

DETAILED DESCRIPTION OF THE INVENTION

First Embodiment

Figure 3A:
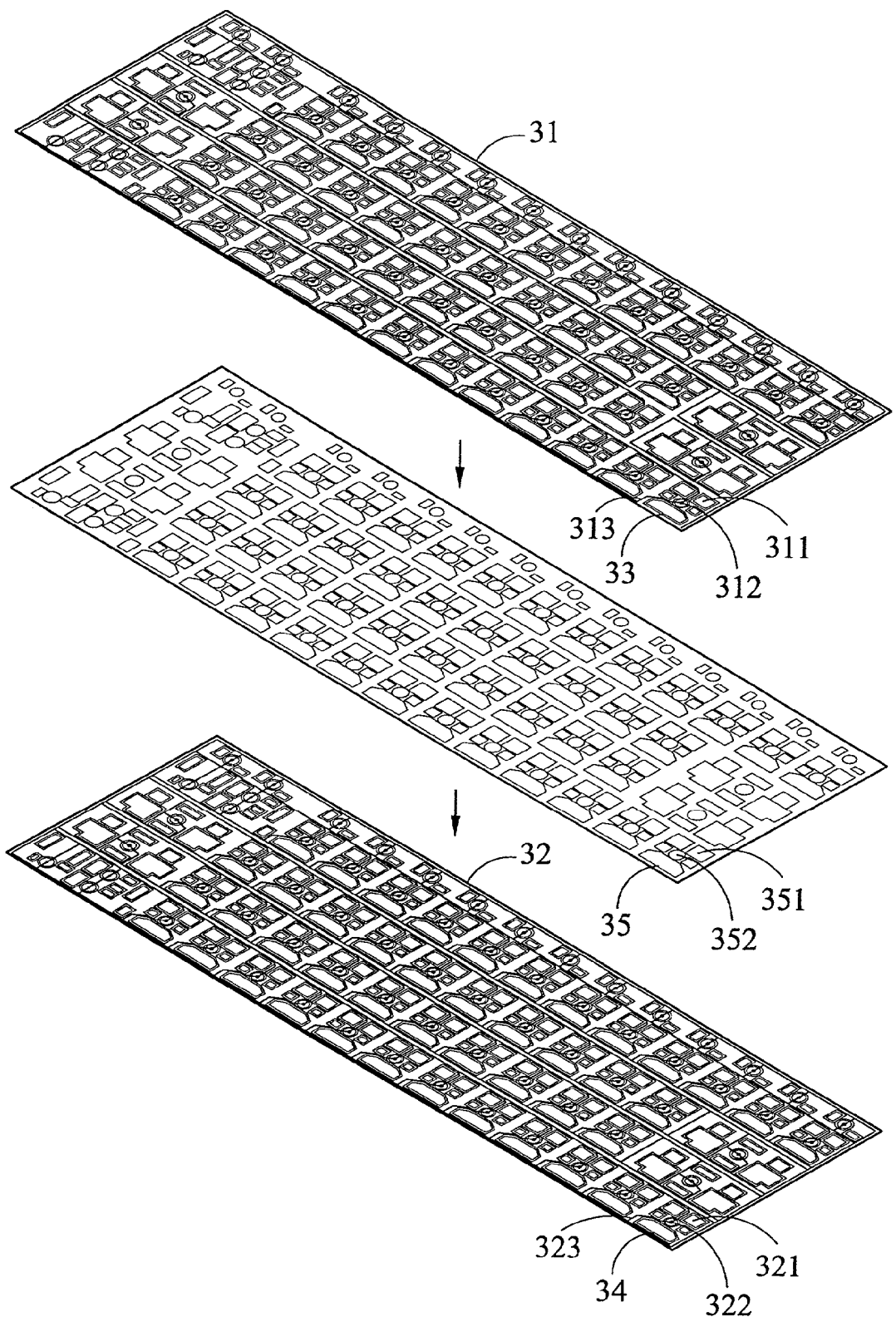
FIGS. 3a, 3b are schematic drawings of a flexible printed circuit board as disclosed in a first embodiment of this invention.

A flexible printed circuit board 30 as disclosed in a first embodiment of this invention is shown in FIG. 3a, and it comprises a first circuit layer 31, a second circuit layer 32, an intermediate layer 35, a first adhesive layer 33 and a second adhesive layer 34.

The first circuit layer 31 is provided with a plurality of second through holes 311, a plurality of first switches 312, and a first circuit 313 for electrically connecting the first switches 312. The second circuit layer 32 is provided with a plurality of third through holes 321 corresponding to the second through holes 311 respectively, a plurality of second switches 322 corresponding to the first switches 312 respectively, and a second circuit 323 for electrically connecting the second switches 322. The second switches 322, disposed on the second circuit layer 32, face the first switches 312 disposed on the first circuit layer 31. That is, the second switches 322 are disposed on a surface, facing the first circuit layer 31, of the second circuit layer 32, and the first switches 312 are disposed on a surface, facing the second circuit layer 32, of the first circuit layer 31.

The first adhesive layer 33 is disposed on the first circuit layer 31 in a manner such that it surrounds the second through holes 311 and the first switches 312. The second adhesive layer 34 is disposed on the second circuit layer 32 in a manner such that it surrounds the third through holes 321 and the second switches 322.

The intermediate layer 35, disposed between the first circuit layer 31 and the second circuit layer 32, is provided with a plurality of first through holes 352 and a plurality of fourth through holes 351. Each of the first through holes 352 corresponds to the first switches 312 and the second switches 322 respectively, and each of the fourth through holes 351 corresponds to the second through holes 311 and the third through holes 321 respectively.

Each of the fourth through holes 351 is bigger than the corresponding second through hole 311 and the corresponding third through hole 321, but not big enough to make the first circuit 313, surrounding the second through holes 311, contact the second circuit 323 surrounding the third through holes 321. Specifically, referring to FIG. 3c, since each of the fourth through holes 351 is bigger than the corresponding second through hole 311 and the corresponding third through hole 321, the first adhesive layer 33, surrounding the second through holes 311, directly adheres to the second adhesive layer 34, surrounding the third through holes 321, through the fourth through holes 351.

Similarly, each of the first through holes 352 is formed in a manner such that the first adhesive layer 33, surrounding the first switches 312, directly adheres to the second adhesive layer 34, surrounding the second switches 322, through the first through holes 352. Also, the first circuit 313, surrounding the first switches 312, does not contact the second circuit 323 surrounding the second switches 322 through the first through holes 352.

Furthermore, each of the first switches 312 contacts the corresponding second switch 322 through the corresponding first through hole 352 in a separable manner.

Figure 3B:
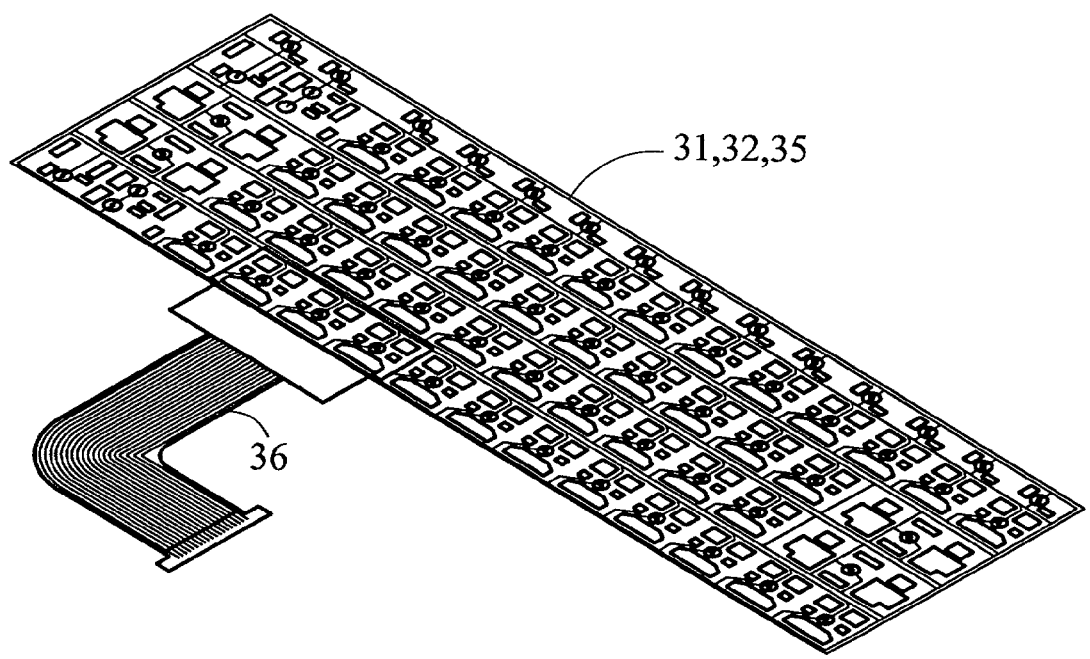
Figure 3C:
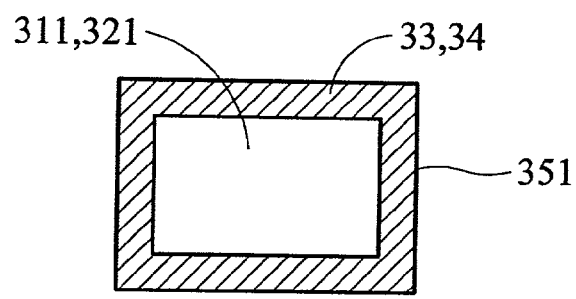

In addition, as shown in FIG. 3b, a cable 36 is electrically connected with the first circuit 313 of the first circuit layer 31 and the second circuit 323 of the second circuit layer 32 respectively.

As stated above, since each of the fourth through holes 351 is bigger than the corresponding second through hole 311 and the corresponding third through hole 321, there is some extra space between the fourth through holes 351 and the corresponding through holes 311, 321. Thus, the first adhesive layer 33, surrounding the second through holes 311, directly adheres to the second adhesive layer 34, surrounding the third through holes 321, through the fourth through holes 351. Also, each of the first through holes 352 is formed in a manner such that the first adhesive layer 33, surrounding the first switches 312, directly adheres to the second adhesive layer 34, surrounding the second switches 322, through the first through holes 352. Thus, since the first adhesive layer 33 directly adheres to the second adhesive layer 34, the waterproof properties of the flexible printed circuit board 30 remain excellent.

Furthermore, since the intermediate layer 35 is disposed between the first circuit layer 31 and the second circuit layer 32, the sensitivity between switches 312, 322 remains proper and stable.

Figure 1A:
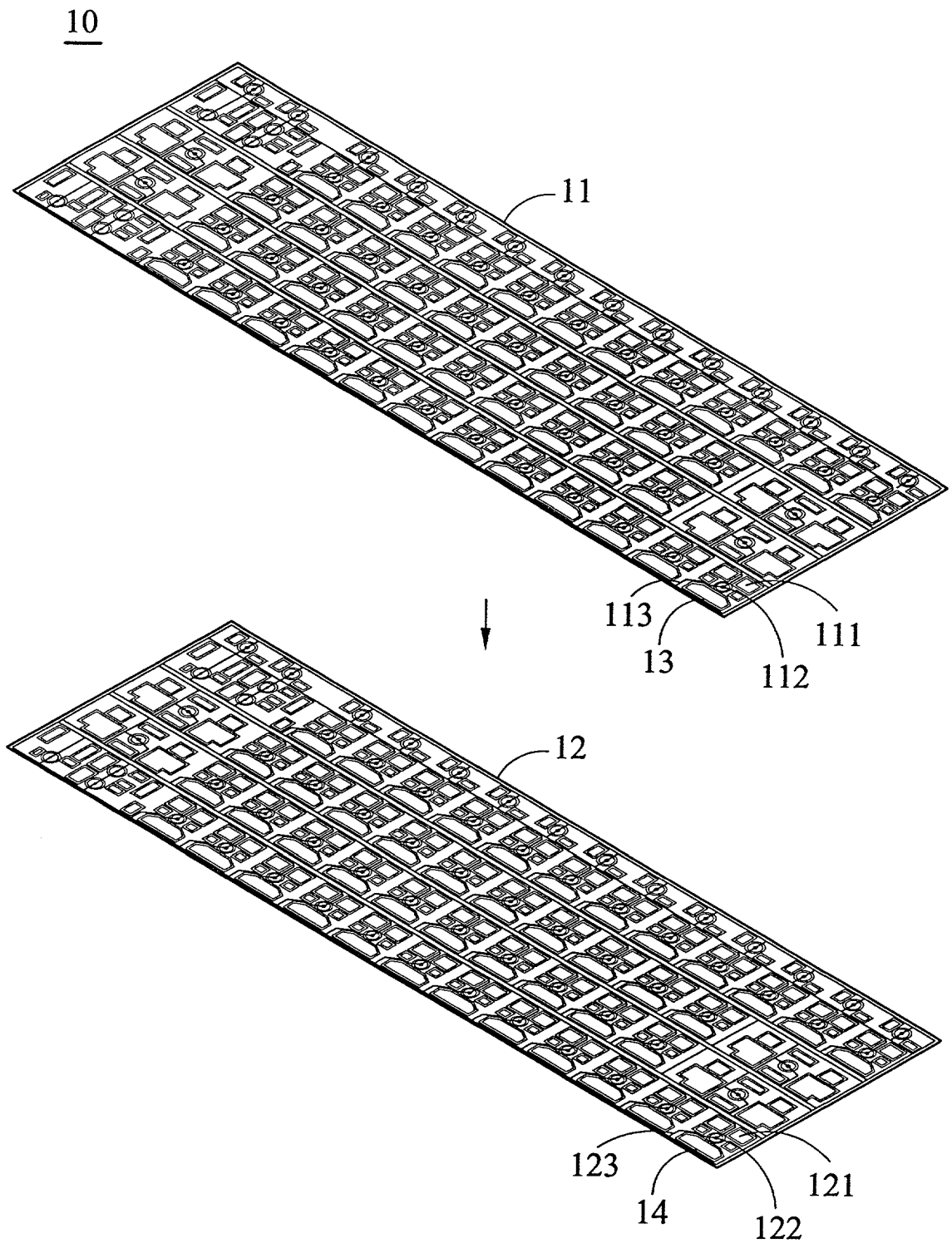
FIGS. 1a, 1b are schematic drawings of a conventional flexible printed circuit board.
Figure 1B:
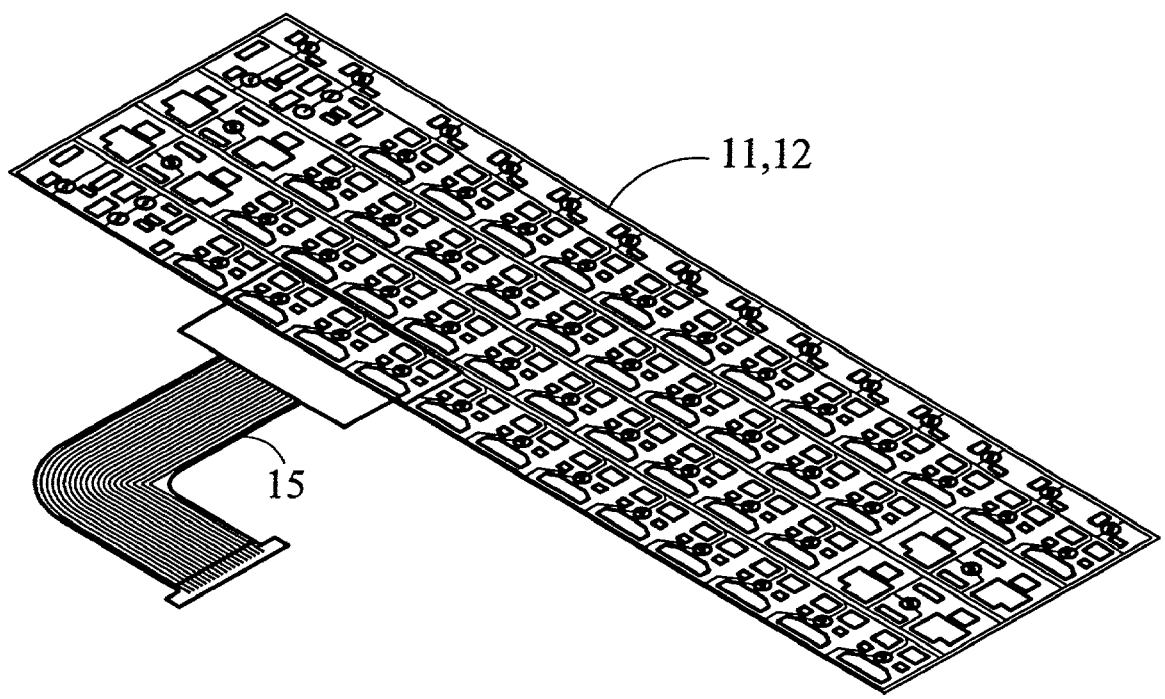
Figure 2A:
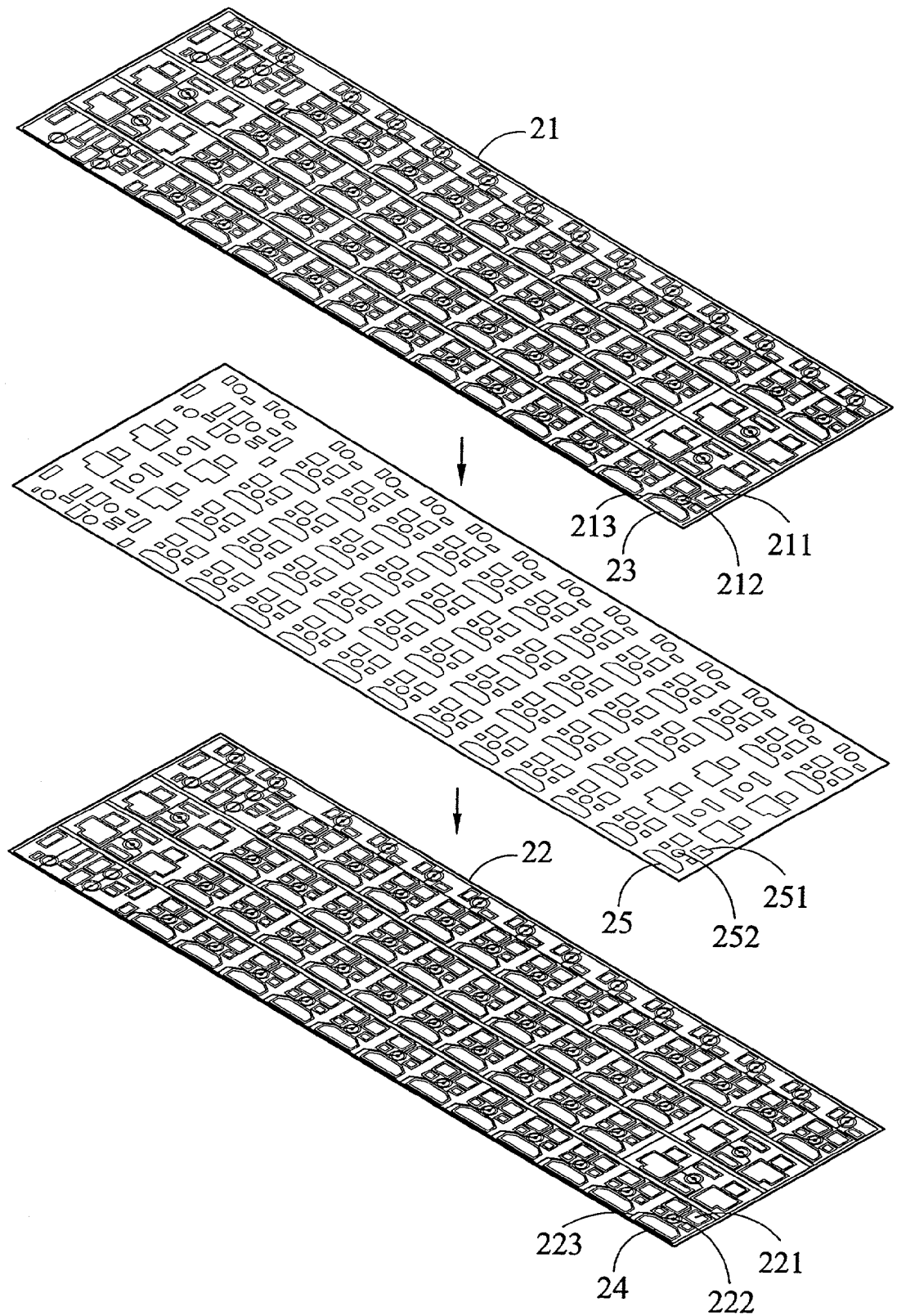
FIGS. 2a, 2b are schematic drawings of another conventional flexible printed circuit board.
Figure 2B:
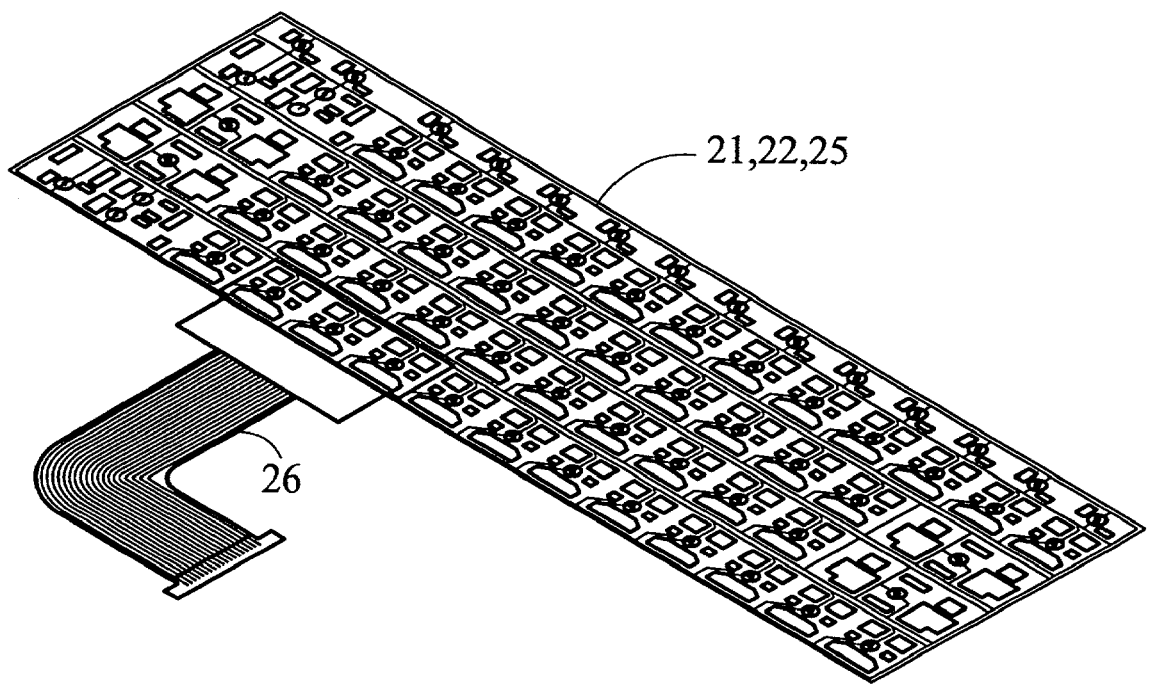

In addition, it is noted that the manufacture method of the flexible printed circuit board of the first embodiment is almost the same as the manufacture method of the conventional flexible printed circuit board as shown in FIG. 2a. The difference between these two methods is that the first through holes and the fourth through holes are produced at the same time in this embodiment. However, this difference can be completed by changing the setting of the equipment, and influences neither process nor time.

Second Embodiment

Figure 4A:
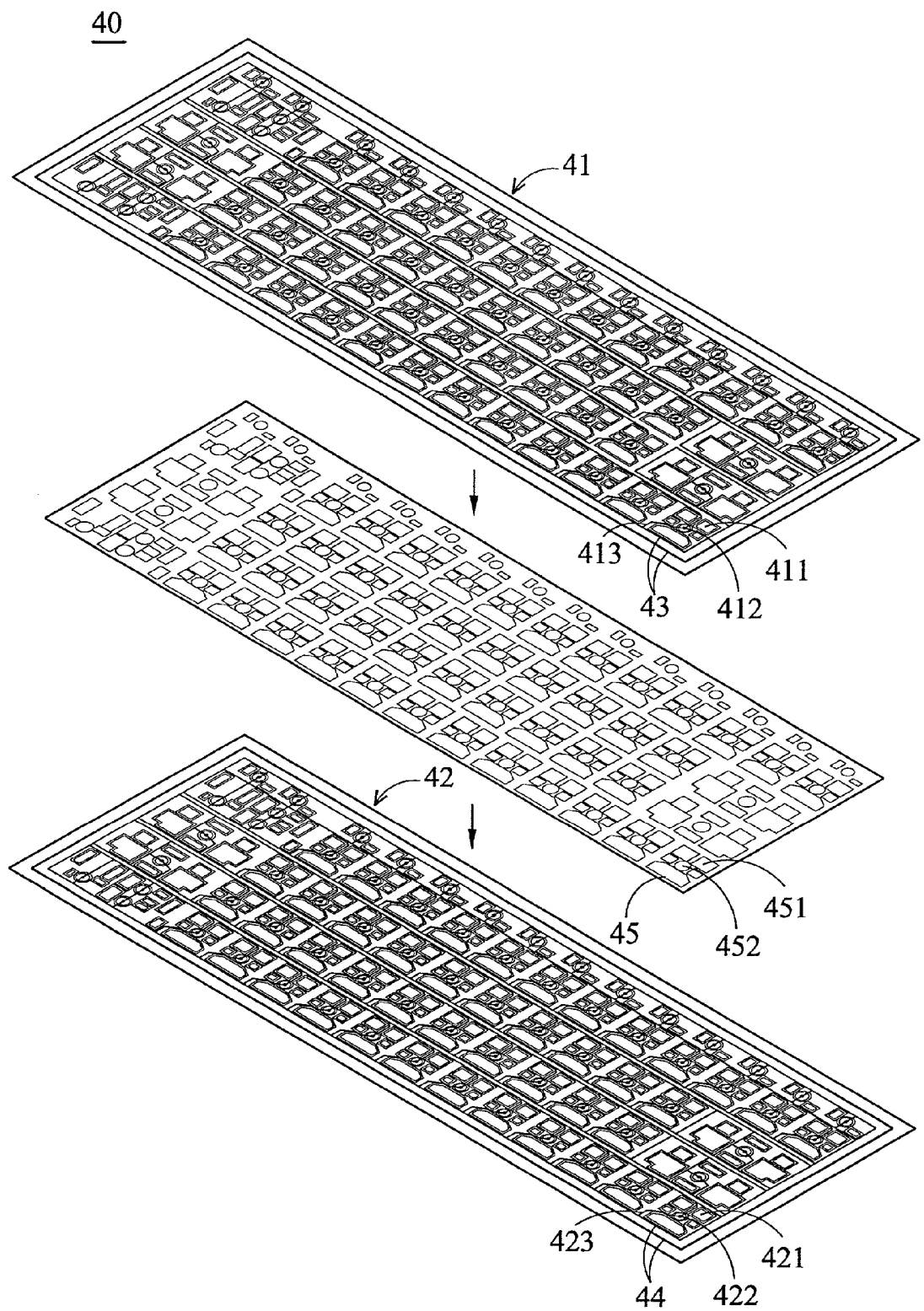
FIG. 4a is a schematic drawing of a flexible printed circuit board as disclosed in a second embodiment of this invention.
Figure 4B:
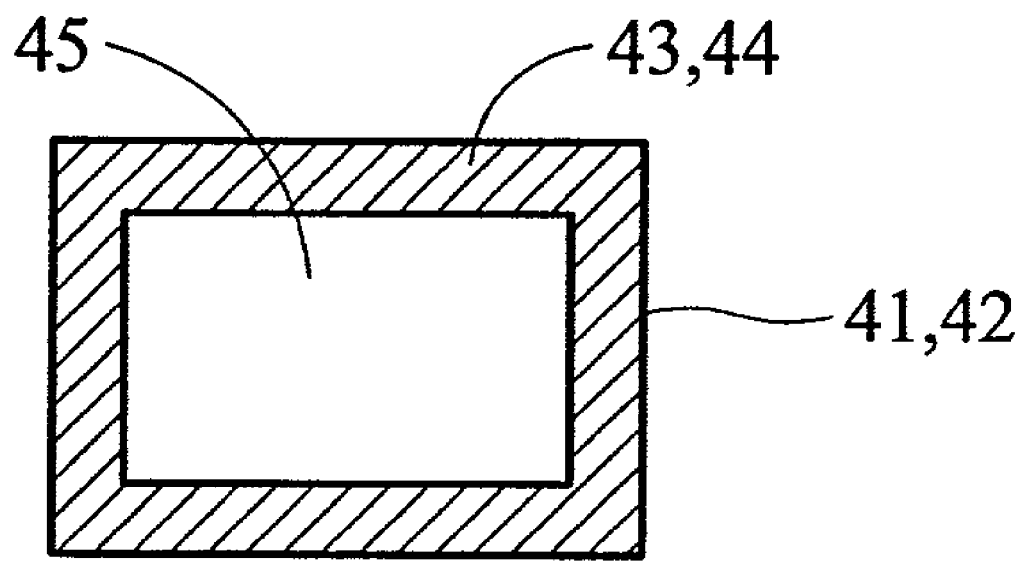

A flexible printed circuit board 40 as disclosed in a second embodiment of this invention is shown in FIG. 4a, and comprises a first circuit layer 41, a second circuit layer 42, an intermediate layer 45, a first adhesive layer 43 and a second adhesive layer 44. The first circuit layer 41 is provided with a plurality of second through holes 411, a plurality of first switches 412, and a first circuit 413 for electrically connecting the first switches 412. The second circuit layer 42 is provided with a plurality of third through holes 421, a plurality of second switches 422, and a second circuit 423 for electrically connecting the second switches 422. The intermediate layer 45 is provided with a plurality of fourth through holes 451, and a plurality of first through holes 452. Since the structure of the above parts is the same as the first embodiment, their description is omitted.

The difference between the second embodiment and the first embodiment is that the intermediate layer 45 is substantially smaller than the first circuit layer 41 and the second circuit layer 42 in this embodiment. Thus, part of the first adhesive layer 43, disposed on the outer periphery of the first circuit layer 41, can directly adhere to part of the second adhesive layer 44 disposed on the outer periphery of the second circuit layer 42.

The flexible printed circuit board of this embodiment is adapted for a device with larger space. As a result, the adhesion between two circuit layers is more convenient.

While the invention has been particularly shown and described with reference to a preferred embodiment, it will be readily appreciated by those of ordinary skill in the art that various changes and modifications may be made without departing from the spirit and scope of the invention. It is intended that the claims be interpreted to cover the disclosed embodiment, those alternatives which have been discussed above, and all equivalents thereto.

What is claimed is:

1. A flexible printed circuit board comprising:
    a first circuit layer;
    a second circuit layer facing the first circuit layer;
    a first adhesive layer disposed on the first circuit layer;
    an intermediate layer disposed between the first circuit layer and the second circuit layer, and substantially smaller than the first circuit layer and the second circuit layer so that the first adhesive layer directly adheres to the second circuit layer; and
    a second adhesive layer, facing the first adhesive layer, disposed on the second circuit layer and directly adhered to the first adhesive layer when the first adhesive layer adheres to the second circuit layer, wherein the first circuit layer is provided with a plurality of second through holes, and the first adhesive layer surrounds the second through holes, and the second circuit layer is provided with a plurality of third through holes corresponding to the second through holes respectively, and the second adhesive layer surrounds the third through holes, and the intermediate layer is provided with a plurality of fourth through holes corresponding to the second and third through holes respectively so that the first adhesive layer, surrounding the second through holes, adheres to the second adhesive layer, surrounding the third through holes, through the fourth through holes.

2. The flexible printed circuit board as claimed in claim 1, wherein the first circuit layer is provided with a plurality of first switches, and the first adhesive layer surrounds the first switches, and the second circuit layer is provided with a plurality of second switches corresponding to the first switches respectively, and the second adhesive layer surrounds the second switches, and the intermediate layer is provided with a plurality of first through holes corresponding to the first and second switches respectively so that the first adhesive layer, surrounding the first switches, adheres to the second adhesive layer, surrounding the second switches, through the first through holes.

3. The flexible printed circuit board as claimed in claim 2, wherein each of the first switches contacts the corresponding second switch through the corresponding first through hole in a separable manner.

4. The flexible printed circuit board as claimed in claim 2, wherein the first circuit layer is provided with a first circuit for electrically connecting the first switches, and the second circuit layer is provided with a second circuit for electrically connecting the second switches.

5. The flexible printed circuit board as claimed in claim 4, further comprising:
    a cable electrically connecting the first circuit and the second circuit.

* * * * *